(12) United States Patent  
Ishikawa et al.

(10) Patent No.: US 7,570,085 B2
(45) Date of Patent: Aug. 4, 2009

(54) GATE DRIVER CIRCUIT FOR SWITCHING DEVICE

(75) Inventors: Katsumi Ishikawa, Hitachinaka (JP); Yutaka Sato, Hitachiota (JP); Masahiro Nagasu, Hitachinaka (JP); Seiji Ishida, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/624,717

(22) Filed: Jan. 19, 2007

(65) Prior Publication Data

US 2007/0200613 A1 Aug. 30, 2007

(30) Foreign Application Priority Data

Feb. 27, 2006 (JP) ............................. 2006-049479

(51) Int. Cl.
*H03K 3/00* (2006.01)
(52) U.S. Cl. ...................................... 327/108; 361/101
(58) Field of Classification Search ................. 327/108; 361/101
See application file for complete search history.

(56) References Cited

U.S. PATENT DOCUMENTS

| | | | | |
|---|---|---|---|---|
| 3,200,348 A | * | 8/1965 | Kammiller et al. ............. 331/62 |
| 4,315,303 A | * | 2/1982 | Snyder ..................... 363/21.17 |
| 4,447,841 A | * | 5/1984 | Kent ........................... 361/18 |
| 4,616,301 A | * | 10/1986 | Small .......................... 363/26 |
| 4,686,383 A | * | 8/1987 | Croft ......................... 327/198 |
| 5,006,949 A | * | 4/1991 | Guajardo ..................... 361/18 |
| 5,369,308 A | * | 11/1994 | Schoofs et al. .............. 327/427 |
| 5,375,028 A | * | 12/1994 | Fukunaga ................... 361/93.7 |
| 5,418,707 A | * | 5/1995 | Shimer et al. ................. 363/65 |
| 5,422,593 A | * | 6/1995 | Fujihira ..................... 327/561 |
| 5,499,154 A | * | 3/1996 | Cullison ..................... 361/18 |
| 5,808,504 A | * | 9/1998 | Chikai et al. ................ 327/434 |
| 5,936,387 A | * | 8/1999 | Tabata et al. ................ 323/225 |
| 6,084,760 A | * | 7/2000 | Nomura ...................... 361/111 |
| 6,181,186 B1 | * | 1/2001 | Itoh et al. ................... 327/309 |
| 6,271,709 B1 | * | 8/2001 | Kimura et al. .............. 327/380 |
| 6,498,437 B1 | * | 12/2002 | Chang et al. ................ 315/141 |
| 6,717,785 B2 | * | 4/2004 | Fukuda et al. ............. 361/93.1 |
| 7,026,783 B2 | * | 4/2006 | Eckardt ..................... 318/400.3 |
| 7,215,525 B2 | * | 5/2007 | Usui .......................... 361/103 |
| 7,449,935 B2 | * | 11/2008 | Scollo et al. ................ 327/374 |

FOREIGN PATENT DOCUMENTS

| | | |
|---|---|---|
| GB | 2417149 | 2/2006 |
| JP | 2000-228868 | 8/2000 |
| JP | 2000-232347 | 8/2000 |

* cited by examiner

*Primary Examiner*—Kenneth B. Wells
(74) *Attorney, Agent, or Firm*—Antonelli, Terry, Stout & Kraus, LLP.

(57) ABSTRACT

A gate driver circuit of a voltage drive type power semiconductor switching device capable of speeding up di/dt and dv/dt even during large-current driving to thereby reduce the switching loss is disclosed. This power semiconductor switching device gate driving circuit includes a drive circuit which applies a drive signal to the gate electrode of the power semiconductor switching device and a measurement unit for measuring a flow current of the power semiconductor switching device. Based on a detected value of the flow current of the power semiconductor switching device, the gate is made variable in mirror voltage thereof.

12 Claims, 10 Drawing Sheets

GATE DRIVER CIRCUIT FOR SWITCHING DEVICE

FIELD OF THE INVENTION

The present invention relates to gate driver circuitry of voltage-driven power semiconductor switching devices adaptable for use in electric power conversion apparatus.

Figure 6:
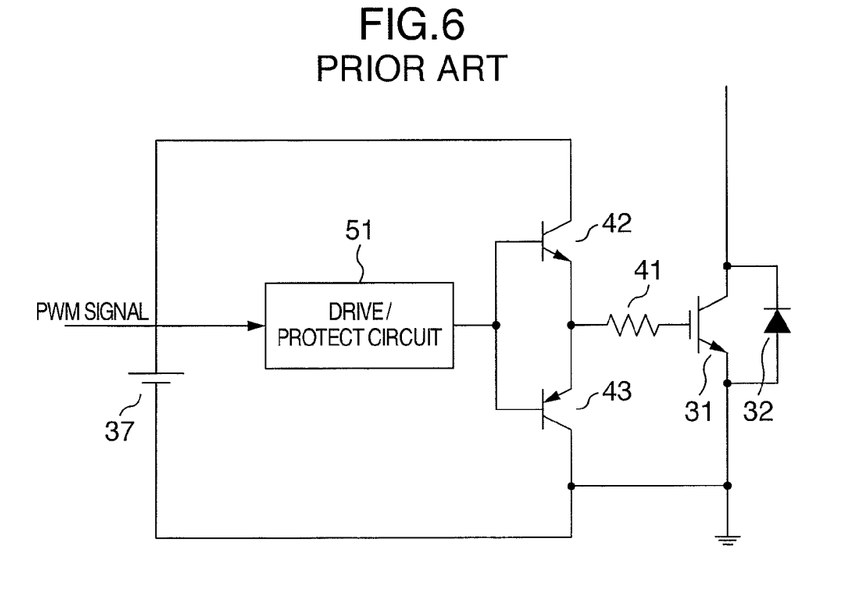
FIG. 6 is a circuit diagram of a prior known MOSFET/IGBT gate driver circuit.
Figure 7:
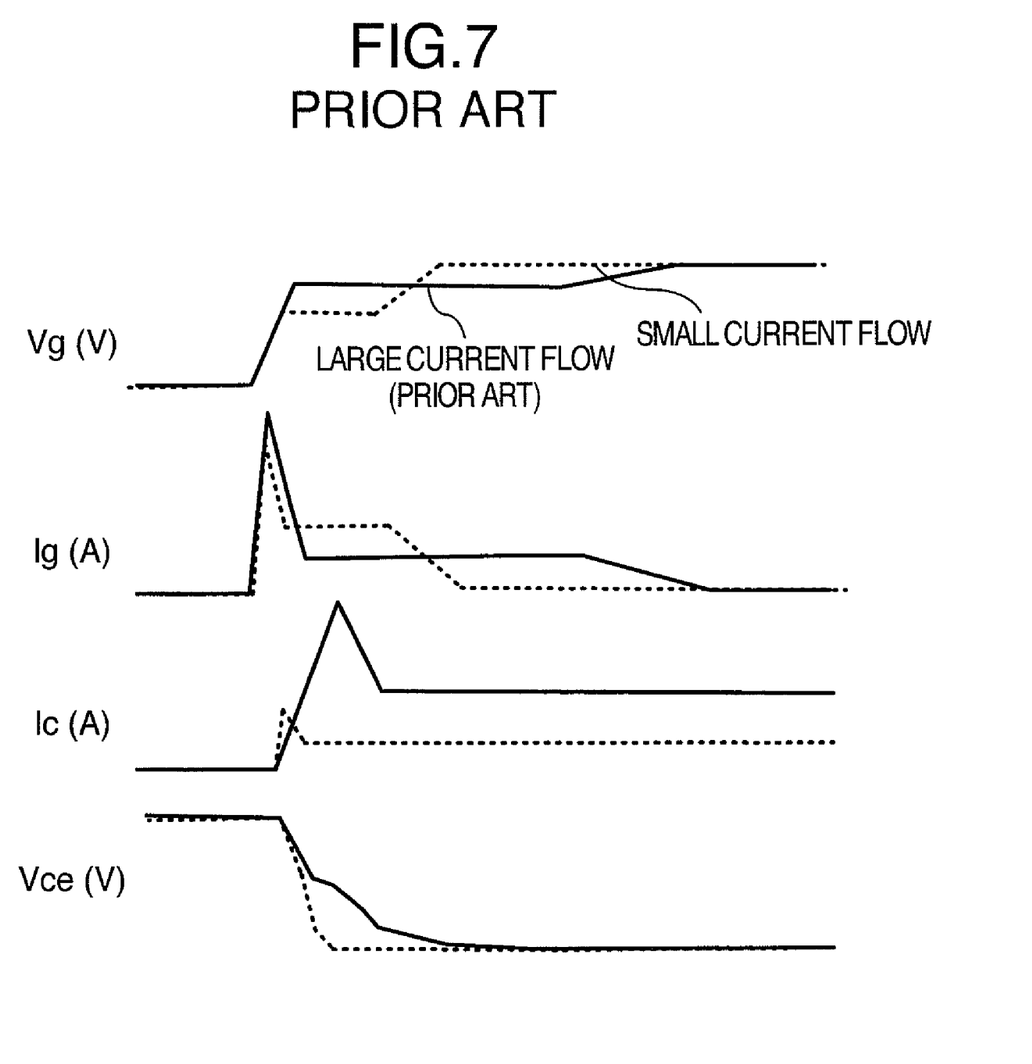
FIG. 7 shows major switching waveforms of an IGBT in the prior art circuit of FIG. 6.

Voltage-driven power semiconductor circuit elements include metal oxide semiconductor field effect transistors (MOSFETs) and insulated-gate bipolar transistors (IGBTs), which are recently under dramatic advances in designs for achievement of higher breakdown voltage and larger current. One typical prior art MOSFET/IGBT gate driver circuit is shown in FIG. 6. Some typical voltage/current waveforms in the circuit of FIG. 6 are shown in FIG. 7, such as the waveforms of a gate voltage, gate current, collector current and collector-emitter current in the case of an IGBT being driven to perform its switching operations. The case of a small current is indicated by dotted line, and the case of a large current is by solid line.

Prior known techniques for controlling the collector current waveform and the collector-emitter voltage waveform are disclosed in JP-A-2000-228868, paragraph Nos. 0010 to 0014, and JP-A-2000-232347, paragraph Nos. 0057 to 0072. JP-A-2000-228868 discloses therein a technique for controlling the rise rate of current (di/dt) and voltage rise rate (dv/dt) when IGBT turns on and off in response to receipt of a detected value of the gate voltage of the IGBT. JP-A-2000-232347 teaches a gate voltage control technique by use of a gate circuit, which includes a first on-gate circuit that supplies a first on-gate current and a second on-gate circuit for supplying a second on-gate current after the elapse of a prespecified length of time since the start-up of supplying the first on-gate current.

FIG. 7 shows the waveforms of a gate voltage, gate current, collector current and collector voltage in the case of an IGBT being driven to perform switching. The case of a small current is indicated by dotted line, while the case of a large current is by solid line. When the IGBT turns on, its gate current Ig that flows within a mirror period is almost determinable by the following equation.

$$Ig=(Vg-Vth)/Rg,$$

where Vg is the control gate voltage, Vth is the threshold voltage equivalent to a mirror voltage, and Rg is the gate resistance. Upon execution of large-current driving, the mirror voltage Vth becomes greater in value. Thus, as the collector current increases in magnitude, the mirror-period gate current Ig becomes smaller. When the gate current Ig becomes less, di/dt and dv/dt at the time the IGBT turns on and off become moderate—i.e., their profiles are ramped more gently. This poses a drawback as to the lack of an ability to perform switching at high speeds.

Although the techniques as disclosed in JP-A-2000-228868 and JP-A-2000-232347 involve teachings as to the control of di/dt and dv/dt in IGBT's turn-on/off events, these are not the control scheme pursuant to a current flowing in main circuitry. For this reason, control based on whether the current is large or small cannot be carried out. Accordingly, the prior art approaches are faced with a problem which follows: upon execution of large-current driving, di/dt and dv/dt become moderate, resulting in the loss becoming greater.

SUMMARY OF THE INVENTION

It is therefore an object of this invention to provide a technique for increasing the current rise rate di/dt and voltage rise rate dv/dt even when performing large-current driving to thereby reduce the switching loss.

To attain the foregoing object, a power semiconductor switching device gate driving circuit incorporating the principles of this invention is arranged to include a drive circuit for giving a drive signal to the gate electrode of a voltage-driven power semiconductor switching device and a measurement unit operative to measure an electrical current flowing in the power semiconductor switching device. Based on a detected value of the flow current of the power semiconductor switching device, the gate is made variable in mirror voltage thereof. Further, performing detection of a gate voltage simultaneously makes it possible to achieve control with higher accuracy.

In accordance with another aspect of the invention, a power semiconductor switching device gate driver circuit is provided, which includes a drive circuit for applying a drive signal to the gate electrode of a voltage-driven power semiconductor switching device and a measurement unit for measuring a flow current of the power semiconductor switching device. A gate driver circuit of the power semiconductor switching device includes a constant current circuit. Based on a detected value of the flow current of the power semiconductor switching device, a gate current is varied in magnitude.

As the gate current within a mirror period of the switching device is controlled in response to receipt of the detected value of a main circuit current of the voltage-driven power semiconductor switching device, it is possible to provide enhanced control in a way well pursuant to a large or small current. This makes it possible to speed up di/dt and dv/dt even upon execution of large-current driving, thereby to enable reduction of the switching loss.

Other objects, features and advantages of the invention will become apparent from the following description of the embodiments of the invention taken in conjunction with the accompanying drawings.

DETAILED DESCRIPTION OF THE INVENTION

Several embodiments of this invention will be described in detail with reference to the accompanying drawings below.

Embodiment 1

Figure 1:
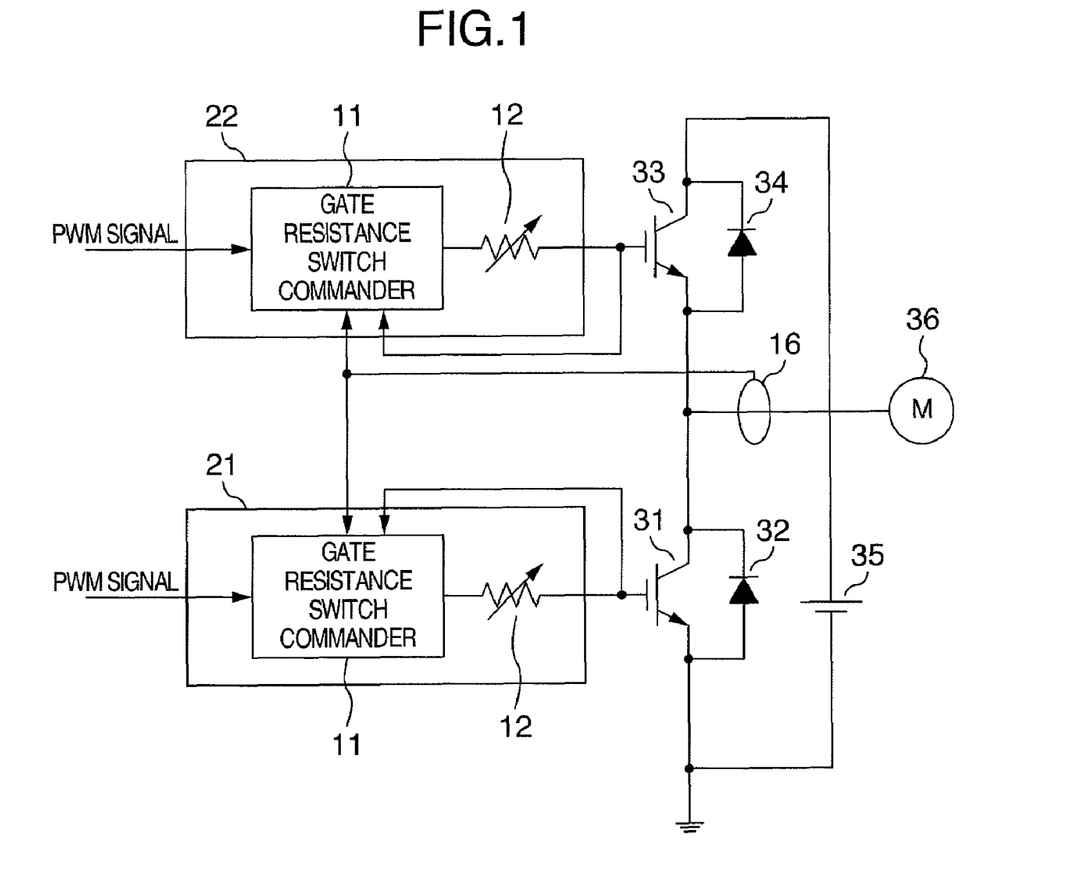
FIG. 1 is a block diagram of a driver circuit of power semiconductor switching devices of an embodiment 1.

FIG. 1 shows, in block diagram form, a gate driver circuit for power semiconductor switching devices in accordance with one embodiment of this invention. The driver circuit as shown herein is arranged to have a half-bridge IGBT module configuration. On its lower arm side, a voltage-driven switching device such as IGBT 31 and a "free-wheel" diode 32 are connected together in parallel. On an upper arm side, an IGBT 33 which is a voltage-driven switching device and a freewheel diode 34 are parallel-coupled together. The node between upper and lower arm is connected to an electrical motor 36. In this embodiment, a current flowing in this motor is detected and measured by a current transformer 16. The IGBT 31 for the lower arm has its gate terminal which is connected to a lower arm driver circuit 21 incorporating the principles of this invention, while the IGBT 33 for the upper arm has a gate node that is coupled to an upper arm driver circuit 22 of this invention. In the illustrative embodiment the current transformer 16 measures a main-circuit current of IGBTs and then inputs its measured value to a gate resistance changeover control unit 11. Additionally, it measures an IGBT gate voltage and inputs a resultant measured value to the gate resistance changeover controller 11. An output signal of this gate resistance changeover controller 11 is used to vary a gate resistor 12.

Figure 2:
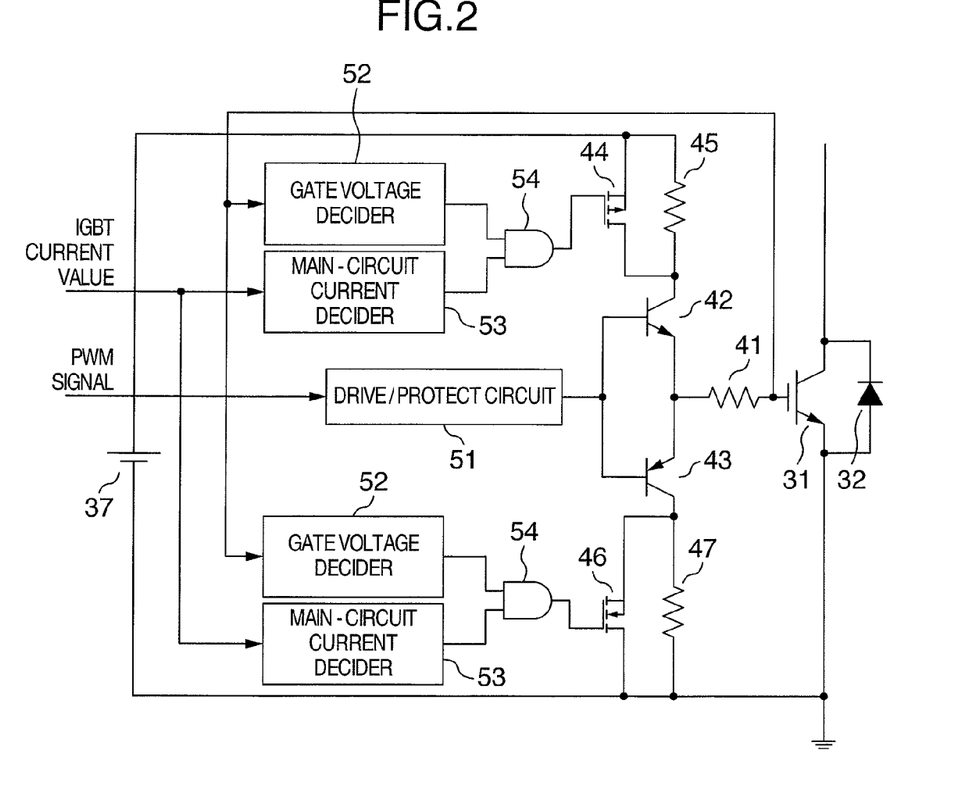
FIG. 2 is a detailed circuit diagram of the power semiconductor device driver circuit of the embodiment 1.

A detailed configuration of the embodiment driver circuit of FIG. 1 is depicted in FIG. 2, specifically using the arm driver circuit 21 coupled to the IGBT 31 and the diode 32 as an example. In FIG. 2, the same parts or components are designated by the same reference numerals as used in FIG. 1. See FIG. 6, which shows a prior art standard IGBT gate driver circuit for MOSFETs or IGBTs. In the prior art gate driver circuit, its for connection to a drive/protection circuit 51 and the gate terminal of IGBT is made up of a gate resistor 41, an npn transistor 42 and a pnp transistor 43. By contrast, this embodiment is provided with a gate voltage determination unit 52 and a main-circuit current determination unit 53, coupled to the pMOSFET 44 through gate 54 for causing the pMOSFET 44 to turn on in the case where the main-circuit current is large in magnitude and also while the gate voltage is within a mirror period, thereby lessening the gate resistance. A similar arrangement with units 52 and 53 is also provided for driving nMOSFET 46 in an inverse manner to pMOSFET 44. Resistors 45 and 47 are respectively provided in parallel with the source drain paths of pMOSFET 44 and nMOSFET 45.

FIG. 7 shows some typical waveforms of a gate voltage, a gate current, a collector current and a collector-emitter voltage in the prior art gate driver circuit of FIG. 6 in case IGBT performs a switching operation. Those waveforms obtained in the case of a small current are indicated by dotted line; the case of a large current is by solid line. When IGBT turns on, a gate current Ig that flows within the mirror period is almost determinable by an equation which follows.

$$Ig=(Vg-Vth)/Rg,$$

where Vg is the control gate voltage, Vth is the threshold voltage, i.e., mirror voltage, and Rg is the gate resistance.

Upon execution of large-current driving, the mirror voltage Vth becomes greater in value; thus, the gate current Ig within the mirror period becomes smaller with an increase in collector current. As the gate current Ig becomes less, the rise rate of current di/dt and rise rate of voltage dv/dt at IGBT's turn-on/off events become moderate, i.e., decrease in gradient of profile. Accordingly, the prior art gate driver circuit suffers from the disadvantage as to the lack of an ability to perform high-speed switching operations.

Figure 3:
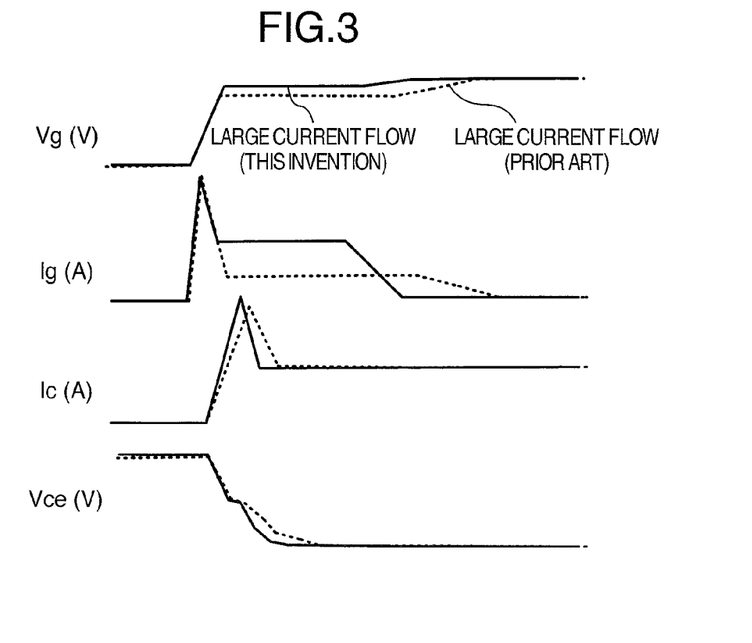
FIG. 3 shows some major switching waveforms of an IGBT in Embodiment 1.

Turning to FIG. 3, the waveforms of a gate voltage, gate current, collector current and collector-emitter voltage are shown in the case where IGBT turns on with the flow of a large current in this embodiment. In FIG. 3, solid lines are used to indicate this embodiment whereas dotted lines are for the prior art. In this embodiment, the gate voltage decider 52 and main-circuit current decider 53 are provided for causing the pMOSFET 44 to turn on while the gate voltage is within the mirror period when the main-circuit current is large, thereby to lower the gate resistance. Lowering the gate resistance during large-current driving makes it possible to speed up the di/dt and dv/dt.

In this embodiment, the gate current of the mirror period of the voltage-driven power semiconductor switching device is controlled in conformity to a detection value of the main-circuit current of such switching device whereby it is possible to provide control in a way depending upon whether it is a large current or a small current. This makes it possible even during large-current driving to speed up di/dt and dv/dt, thus enabling reduction of the switching loss.

Although the description above is drawn to the operation in the turn-on event, it is also possible by using similar arrangement in a turn-off event in this embodiment to speed up di/dt and dv/dt, thereby enabling reduction of the switching loss.

Although this embodiment uses the single unit of main-circuit current decider 53, more than two main-circuit current deciders 53 may be used along with the pMOSFET 44 and a resistor 45. In this case, multi-level controllability is attainable. Additionally, the scheme for current detection is achievable by alternative use of three shunt resistors or one shunt resistor in place of the current transformer 16. While in this embodiment IGBTs are used as the switching devices thereof, the principal concept is also applicable to other types of voltage-driven power semiconductor circuit elements such as MOSFETs, and also, obviously, to silicon carbide (SiC) devices other than silicon (Si) ones.

Embodiment 2

Figure 4:
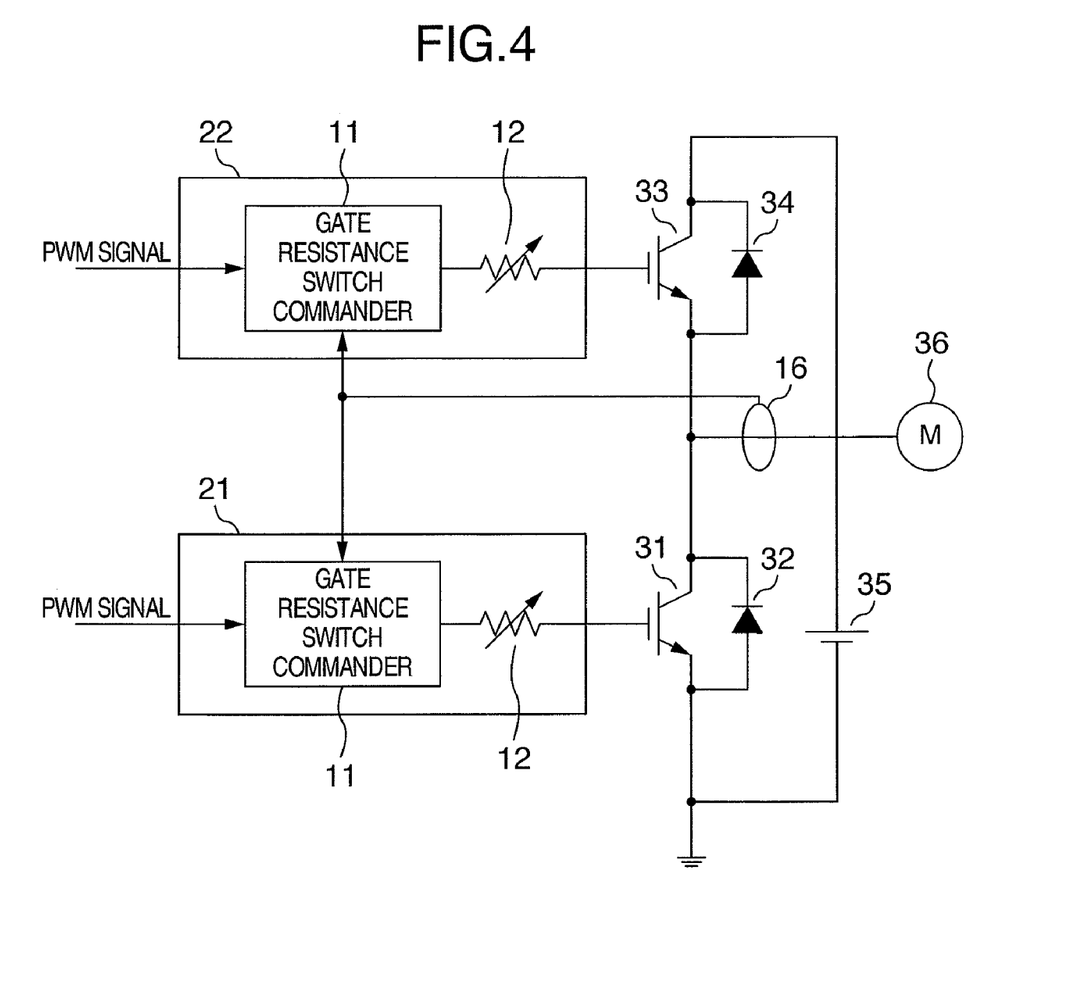
FIG. 4 is a block diagram of a driver circuit of power semiconductor devices of an embodiment 2.
Figure 5:
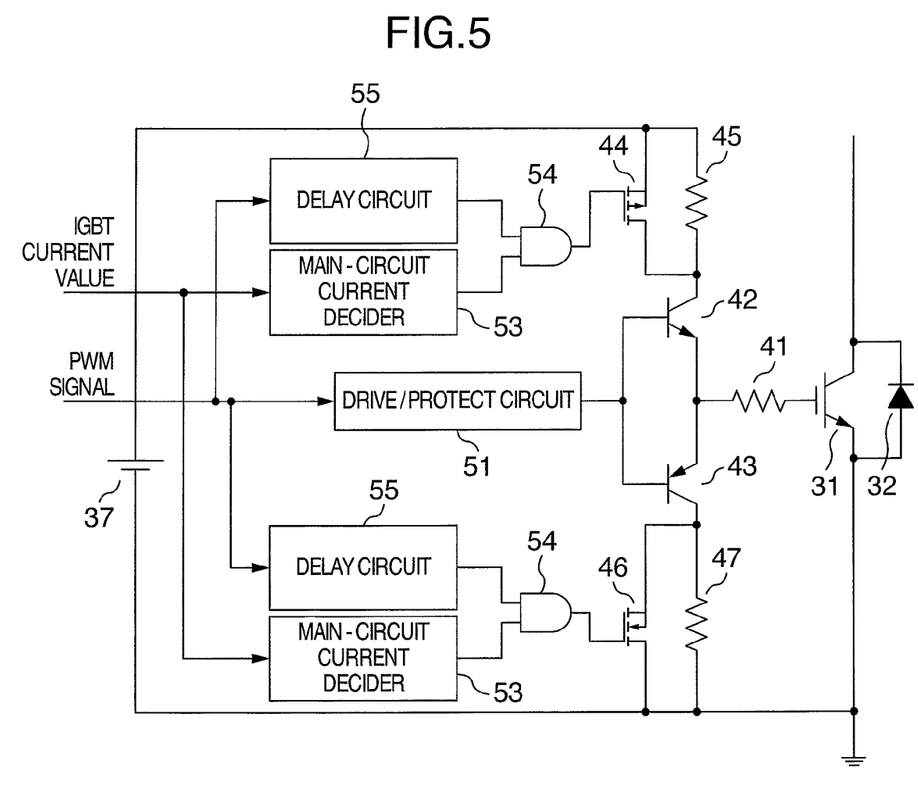
FIG. 5 is a detailed circuit diagram of the power semiconductor device driver circuit of Embodiment 2.

A power semiconductor device driver circuit in accordance with another embodiment of this invention is shown in FIG. 4 in block diagram form. In FIG. 4, similar parts or components are designated by the same reference numerals as used in FIG. 1 of Embodiment 1. A detailed configuration of the driver circuit of FIG. 4 is shown in FIG. 5, wherein like parts are indicated by like reference numerals.

This embodiment is different from Embodiment 1 in that the former lacks feedback of the gate voltage. Even in the absence of such gate voltage feedback feature, the mirror period of IGBT is presumable from the delay time of a pulse width modulation (PWM) signal involved. To this end, this embodiment is provided with a PWM signal delay circuit 55. Owing to this delay circuit 55, the gate-voltage/gate-current control such as shown in FIG. 3 is realizable. Thus it is possible to speed up di/dt and dv/dt even during large-current driving in a way responding to a detected value of the main-circuit current of the voltage-driven power semiconductor switching device, thereby enabling appreciable reduction of the switching loss.

Embodiment 3

Figure 8:
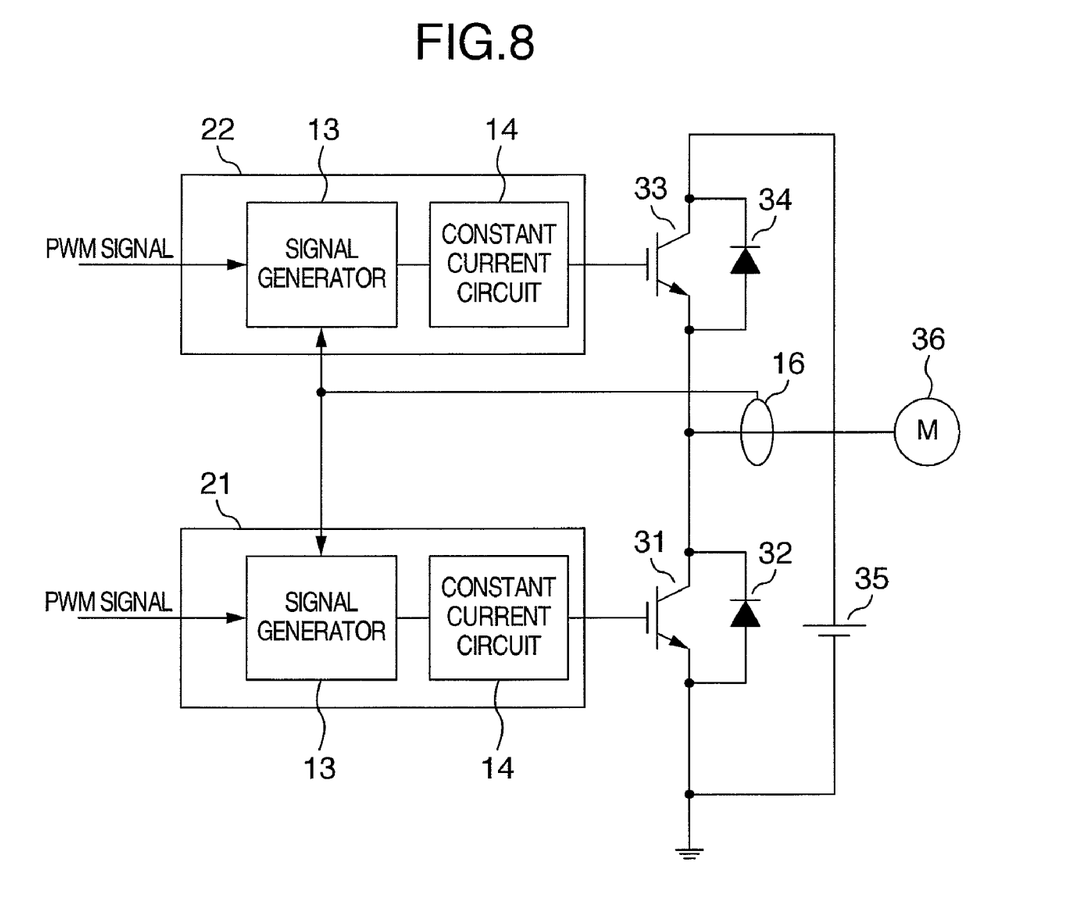
FIG. 8 is a block diagram of a driver circuit of power semiconductor devices of an embodiment 3.

A power semiconductor device driver circuit in accordance with still another embodiment of the invention is shown in FIG. 8 in block diagram form. Like parts or components are denoted by like reference characters as used in FIG. 1 of Embodiment 1. In a drive circuit 21 for use in the lower arm of this embodiment, a current transformer 16 is provided to measure a main-circuit current of IGBT. From a measurement result of such IGBT main-circuit current, a voltage control signal or "command" is created by a signal generation unit 13 and is then given to a constant current circuit 14. In this way, the constant current circuit 14 drives the IGBT 31.

Figure 9:
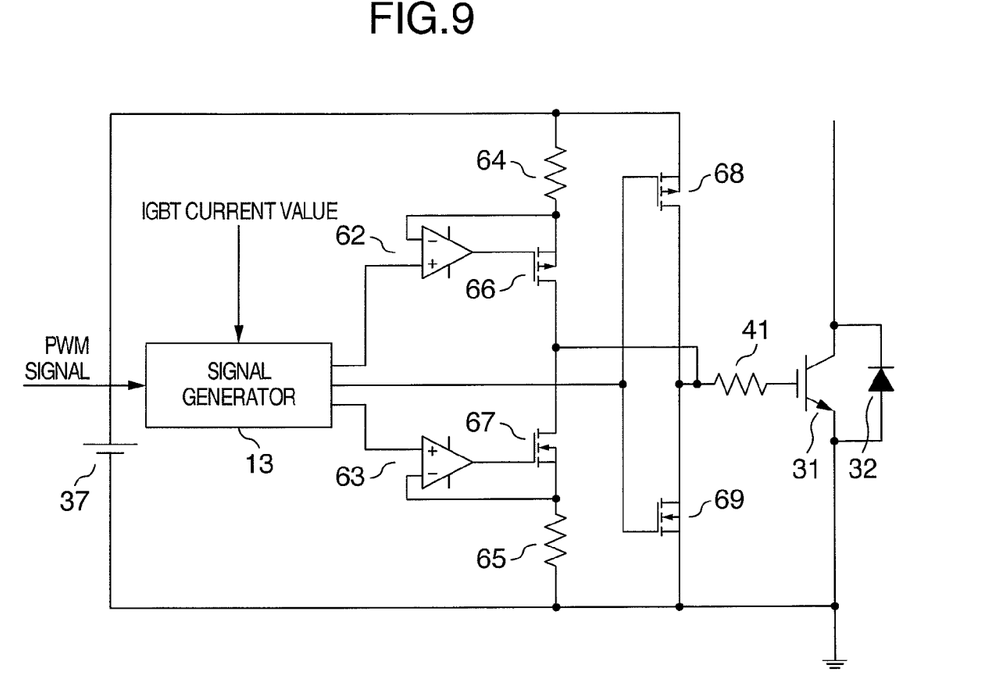
FIG. 9 is a detailed circuit diagram of the power semiconductor device driver circuit of Embodiment 3.

A detailed configuration of the constant current circuit 14 of the FIG. 8 embodiment is shown in FIG. 9, wherein like parts are designated by like reference numerals. The constant current circuit 14 is generally made up of operational amplifiers 62-63, resistors 64-65, pMOSFET 66 and nMOSFET 67, and is operatively responsive to receipt of a command voltage from the signal generator 13 for performing constant current control. After completion of the constant current control, the pMOSFET 68 and nMOSFET 69 cause the gate voltage of IGBT 31 to be fixed either to the power supply voltage of a gate driver circuit control power supply module 37 or to ground potential.

Figure 10:
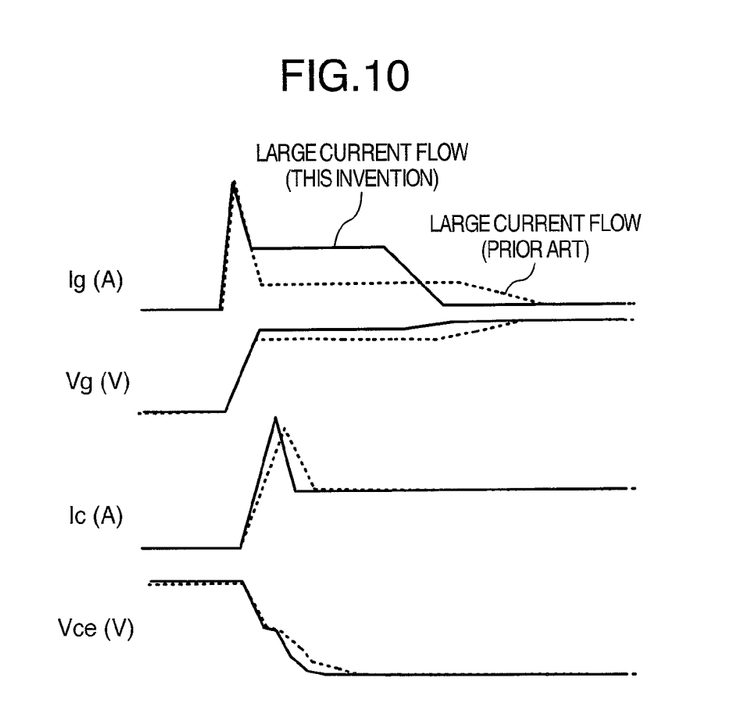
FIG. 10 depicts switching waveforms of an IGBT in Embodiment 3.

See FIG. 10, which shows the waveforms of a gate voltage, gate current, collector current and collector voltage in case IGBT turns on in association with the flow of a large current in this embodiment. In FIG. 10, solid lines are used for indication of this embodiment whereas dotted lines are for the prior art. In this embodiment, upon execution of large-current driving, the signal generator 13 and constant current circuit 14 permit the gate current to increase within the mirror period whereby the gate drivability is improved so that it is possible to speed up di/dt and dv/dt.

Embodiment 4

Figure 11:
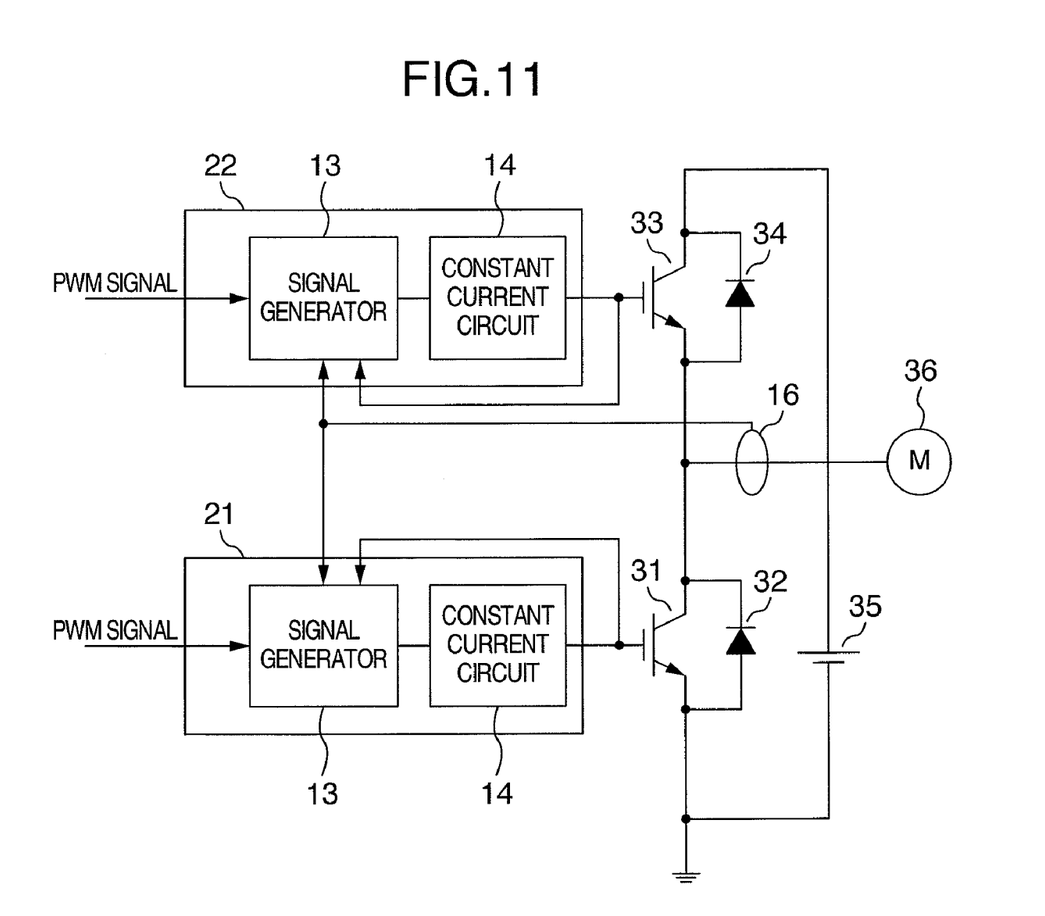
FIG. 11 is a block diagram of a driver circuit of power semiconductor devices of Embodiment 4.

A power semiconductor device driver circuit in accordance with a further embodiment is shown in FIG. 11 in block diagram form. Like parts are denoted by like reference characters as used in FIG. 8 of Embodiment 3. In this embodiment, a detected value of the gate voltage is fed back to signal generator 13. Feedback of the detected value of gate voltage makes it possible to provide the intended control with much increased accuracy. In this embodiment also, during large-current driving, the signal generator 13 and constant current circuit 14 permit the gate current to increase within the mirror period whereby the gate drivability is enhanced. Thus it is possible to speed up di/dt and dv/dt.

Embodiment 5

Figure 12:
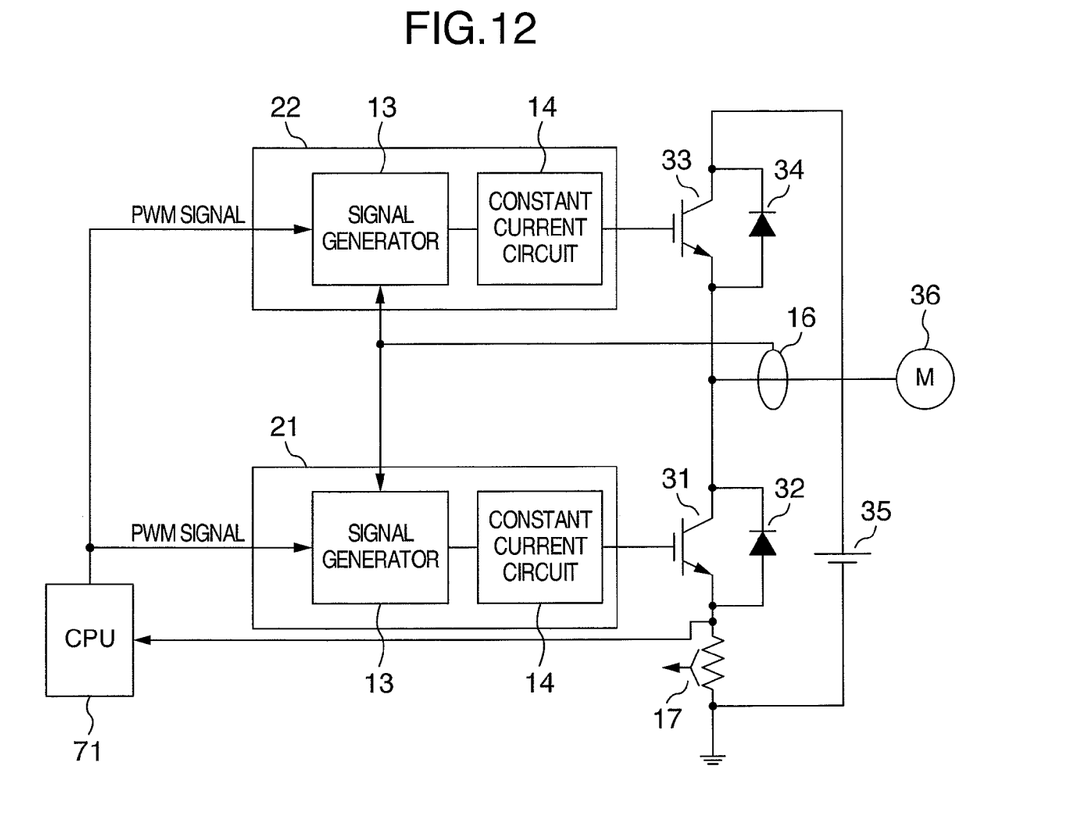
FIG. 12 is a block diagram of a driver circuit of power semiconductor devices of Embodiment 5.

A power semiconductor device driver circuit in accordance with another further embodiment is shown in FIG. 12 in block diagram form. Like parts are indicated by like reference numerals as used in FIG. 8 of Embodiment 3. In this embodiment the current detection unit is designed to use a shunt resistor 17. A voltage value of shunt resistor 17 is fed back to a central processing unit (CPU) 71. This CPU 71 permits feedback of the value of a main-circuit current to the signal generator 13. In responding to receipt of a command voltage from signal generator 13, it provides constant current control. In this embodiment also, during large-current driving, the signal generator 13 and constant current circuit 14 cause the gate current to increase within the mirror period whereby the gate drivability is improved so that it is possible to speed up di/dt and dv/dt.

Embodiment 6

Figure 13:
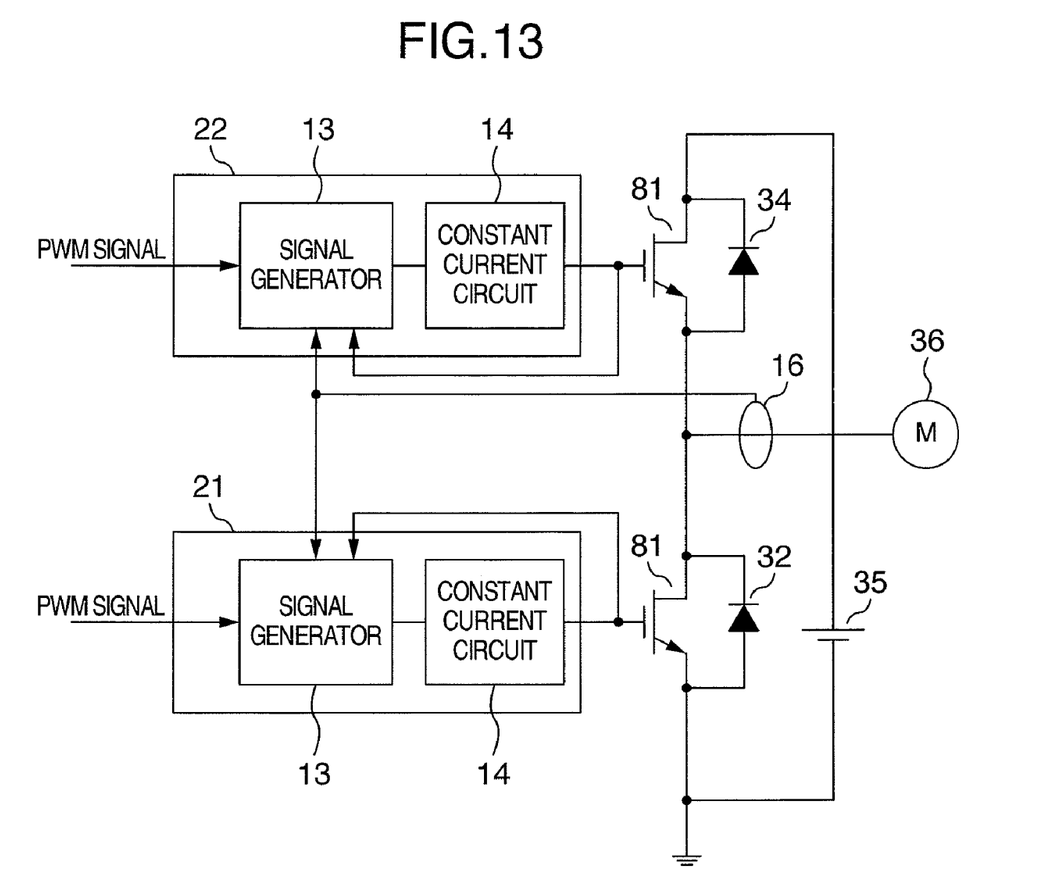
FIG. 13 is a block diagram of a driver circuit of power semiconductor devices of Embodiment 6.

A power semiconductor device driving circuit also embodying this invention is depicted in FIG. 13 in block diagram form. Like parts are indicated by like reference numerals as used in FIG. 1 of Embodiment 1. Its difference from Embodiment 1 is that the voltage drive type power semiconductor switching devices to be driven are not the IGBTs 31 and 33 but SiC junction FETs 81. The target devices to be driven here may be any available voltage-driven switching devices of the type having mirror voltage generation capabilities, including but not limited to Si, SiC and GaN-based semiconductor circuit elements. Additionally, not only IGBTs and MOSFETs but also junction FETs are voltage-driven switching devices with mirror voltage generatability, and this embodiment is also applicable thereto.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. The gate driver circuit for use with a voltage drive type power semiconductor switching device, comprising:
 a drive circuit for giving a drive signal to a gate electrode of the power semiconductor switching device;
 means for measuring a flow current of the power semiconductor switching device; and
 means for switching a gate resistor in the drive circuit for causing a voltage of the gate to be varied based on a detection value of the flow current of said power semiconductor switching device such that gate resistance of the power semiconductor switching device will decrease as gate current of the power semiconductor switching device increases,
 further comprising:
 a constant current circuit in a gate circuit of said power semiconductor switching device; and
 means for varying a gate current based on a detected value of the flow current of said power semiconductor switching device.

2. The gate driver circuit according to claim 1, wherein an output current of said constant current circuit is changed in a plurality of steps to thereby drive said power semiconductor switching device.

3. The gate driver circuit according to claim 1, wherein said constant current circuit includes an operational amplifier, a resistor, and a metal oxide semiconductor field effect transistor ("MOSFET").

4. The gate driver circuit according to claim 1, wherein said means for detecting a flow current of said power semiconductor switching device is a current transformer.

5. The gate driver circuit according to claim 1, wherein said means for detecting a flow current of said power semiconductor switching device is a shunt resistor.

6. The gate driver circuit according to claim 1, wherein said gate driver circuit is a drive circuit for a silicon carbide ("SiC") power semiconductor switching device.

7. The gate driver circuit for a voltage-driven power semiconductor switching device, comprising:
- a drive circuit for giving a drive signal to a gate electrode of the power semiconductor switching device;
- means for measuring a flow current of the power semiconductor switching device;
- means for detecting a gate voltage; and
- means for switching a gate resistor in the drive circuit for causing a voltage of the gate to be varied based on a detection value of the flow current of said power semiconductor switching device and a detected value of the gate voltage such that gate resistance of the power semiconductor switching device will decrease as gate current of the power semiconductor switching device increases, further comprising:
- a constant current circuit in a gate circuit of said power semiconductor switching device; and
- means for varying a gate current based on a detected value of the flow current of said power semiconductor switching device and a detected value of the gate voltage.

8. The gate driver circuit according to claim 7, wherein an output current of said constant current circuit is changed in a plurality of steps to thereby drive said power semiconductor switching device.

9. The gate driver circuit according to claim 7, wherein said constant current circuit includes an operational amplifier, a resistor and an MOSFET.

10. The gate driver circuit according to claim 7, wherein said means for detecting a flow current of said power semiconductor switching device is a current transformer.

11. The gate driver circuit according to claim 7, wherein said means for detecting a flow current of said power semiconductor switching device is a shunt resistor.

12. The gate driver circuit according to claim 7, wherein said gate driver circuit is a drive circuit of an SiC power semiconductor switching device.

* * * * *